(12) United States Patent
Demars

(10) Patent No.: US 9,650,727 B2
(45) Date of Patent: May 16, 2017

(54) REACTOR GAS PANEL COMMON EXHAUST

(71) Applicant: Applied Materials, Inc., Santa Clara, CA (US)

(72) Inventor: Dennis L. Demars, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 43 days.

(21) Appl. No.: 14/305,924

(22) Filed: Jun. 16, 2014

(65) Prior Publication Data
US 2015/0011076 A1    Jan. 8, 2015

Related U.S. Application Data

(60) Provisional application No. 61/842,710, filed on Jul. 3, 2013.

(51) Int. Cl.
*C30B 25/14* (2006.01)
*C30B 35/00* (2006.01)
(Continued)

(52) U.S. Cl.
CPC ........... *C30B 25/14* (2013.01); *C23C 16/4412* (2013.01); *C23C 16/45561* (2013.01);
(Continued)

(58) Field of Classification Search
CPC ............ C23C 16/4405; C23C 16/4408; C23C 16/4412; C23C 16/45561; C23C 16/4401–16/4409; C30B 25/14; C30B 35/00; H01L 21/0262; H01L 21/67017; H01L 21/67155–21/67201; H01L 21/67161–21/67178; H01L 21/6719; B01D 2258/02; B01D 2258/0208–2258/0275; B01D 2279/51; F17C 13/0084; F17C 13/12–13/126; F17C 2270/0518; F17C 2205/0111; F17C 2205/0149; F17C 2205/0176;
(Continued)

(56) References Cited

U.S. PATENT DOCUMENTS 4,667,580 A * 5/1987 Wetzel .................... F24F 3/161
165/108
4,738,618 A * 4/1988 Massey et al. ............... 432/241
(Continued)

OTHER PUBLICATIONS

Ministry of Manpower, Occupational Safety & Health Division. "A Guide on Health Hazards and Their Control in Wafer Fabrication Facilities." Dec. 1998. Appendices 1-9. Source location: Government of Singapore. http://www.mom.gov.sg/. Accessed: Jun. 27, 2015.*
(Continued)

*Primary Examiner* — Jeffrie R Lund
*Assistant Examiner* — Stanislav Antolin
(74) *Attorney, Agent, or Firm* — Patterson + Sheridan, LLP

(57) ABSTRACT

A substrate processing system is described that has a reactor and a gas panel, and a common exhaust for the reactor and the gas panel. An exhaust conduit from the reactor is routed to the gas panel, and exhaust gases from the reactor are used to purge the gas panel. Gases from the reactor may be cooled before flowing to the gas panel.

11 Claims, 2 Drawing Sheets

(51) Int. Cl.
*C23C 16/44* (2006.01)
*C23C 16/455* (2006.01)
*H01L 21/67* (2006.01)

(52) U.S. Cl.
CPC ........ *C30B 35/00* (2013.01); *H01L 21/67017* (2013.01); *H01L 21/6719* (2013.01)

(58) Field of Classification Search
CPC ....... F27B 17/0025; F27B 19/02–19/04; H01J 9/385; Y10S 55/30; F24F 3/162; F24F 7/04
See application file for complete search history.

(56) References Cited

U.S. PATENT DOCUMENTS

| | | | | |
|---|---|---|---|---|
| 5,336,325 | A * | 8/1994 | Devilbiss et al. | 118/719 |
| 5,378,283 | A * | 1/1995 | Ushikawa | 118/719 |
| 5,915,414 | A * | 6/1999 | Seaman et al. | 137/377 |
| 6,076,543 | A * | 6/2000 | Johnson | 137/15.17 |
| 6,770,117 | B2 * | 8/2004 | Olander | B01D 53/74 55/338.1 |
| 2004/0002299 | A1 * | 1/2004 | Lin et al. | 454/184 |
| 2004/0083696 | A1 * | 5/2004 | Olander | B01D 53/74 55/385.2 |
| 2005/0039425 | A1 * | 2/2005 | Olander | B01D 53/74 55/385.2 |
| 2007/0062167 | A1 * | 3/2007 | Olander | B01D 53/74 55/385.2 |
| 2008/0032502 | A1 * | 2/2008 | Baskin | C23C 16/4401 438/680 |
| 2008/0063798 | A1 * | 3/2008 | Kher et al. | 427/255.394 |
| 2009/0056116 | A1 * | 3/2009 | Presley et al. | 29/791 |
| 2009/0272272 | A1 * | 11/2009 | Olander | B01D 53/74 96/154 |
| 2010/0092698 | A1 * | 4/2010 | Poppe et al. | 427/585 |
| 2012/0024223 | A1 * | 2/2012 | Torres et al. | 117/104 |
| 2012/0192718 | A1 * | 8/2012 | Sukhman | B01D 53/04 95/287 |
| 2012/0315837 | A1 * | 12/2012 | Olander | F17C 11/00 454/239 |

OTHER PUBLICATIONS

Ministry of Manpower, Occupational Safety & Health Division. "A Guide on Health Hazards and Their Control in Wafer Fabrication Facilities." Dec. 1998. pp. 1-42. Source location: Government of Singapore. http://www.mom.gov.sg/. Accessed: Jun. 27, 2015.*

"Asahi/America Engineering Design Guide for Thermoplastic Piping Systems." 2002. pp. 255. Source location: Asahi/America, Inc. http://asahi-america.com/. Available: http://asahi-america.com/images/x-assets/PDF/Engineering_Guide-Complete.pdf. Accessed: Feb. 17, 2016.*

* cited by examiner

REACTOR GAS PANEL COMMON EXHAUST

CROSS-REFERENCE TO RELATED APPLICATIONS

This application claims benefit of U.S. Provisional Patent Application Ser. No. 61/842,710, filed Jul. 3, 2013, and incorporated herein by reference.

FIELD

Methods and apparatus for semiconductor processing are disclosed herein. More specifically, embodiments disclosed herein relate to methods and apparatus for epitaxial deposition.

BACKGROUND

Epitaxy is a process that is used extensively in semiconductor processing to form very thin material layers on semiconductor substrates. These layers frequently define some of the smallest features of a semiconductor device, and they may have a high quality crystal structure if the electrical properties of crystalline materials are desired. A deposition precursor is normally provided to a processing chamber in which a substrate is disposed, the substrate is heated to a temperature that favors growth of a material layer having desired properties.

Epitaxy processes are typically performed in a reactor by disposing a substrate in the reactor, flowing a precursor gas mixture into the reactor, and performing a reaction that deposits a film on the substrate. Unreacted gases, byproducts, and any gases released by the substrate flow out of the reactor to an exhaust handling system. These gases are typically not recovered.

As manufacturing standards increase, efforts continue to make manufacturing processes more efficient and cost effective. There remains a continuing need for low-cost semiconductor processing chambers and processes.

SUMMARY

Embodiments described herein provide a substrate processing system that has a reactor and a gas panel, and a common exhaust for the reactor and the gas panel. An exhaust conduit from the reactor is routed to the gas panel, and exhaust gases from the reactor are used to purge the gas panel. Gases from the reactor may be cooled before flowing to the gas panel.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
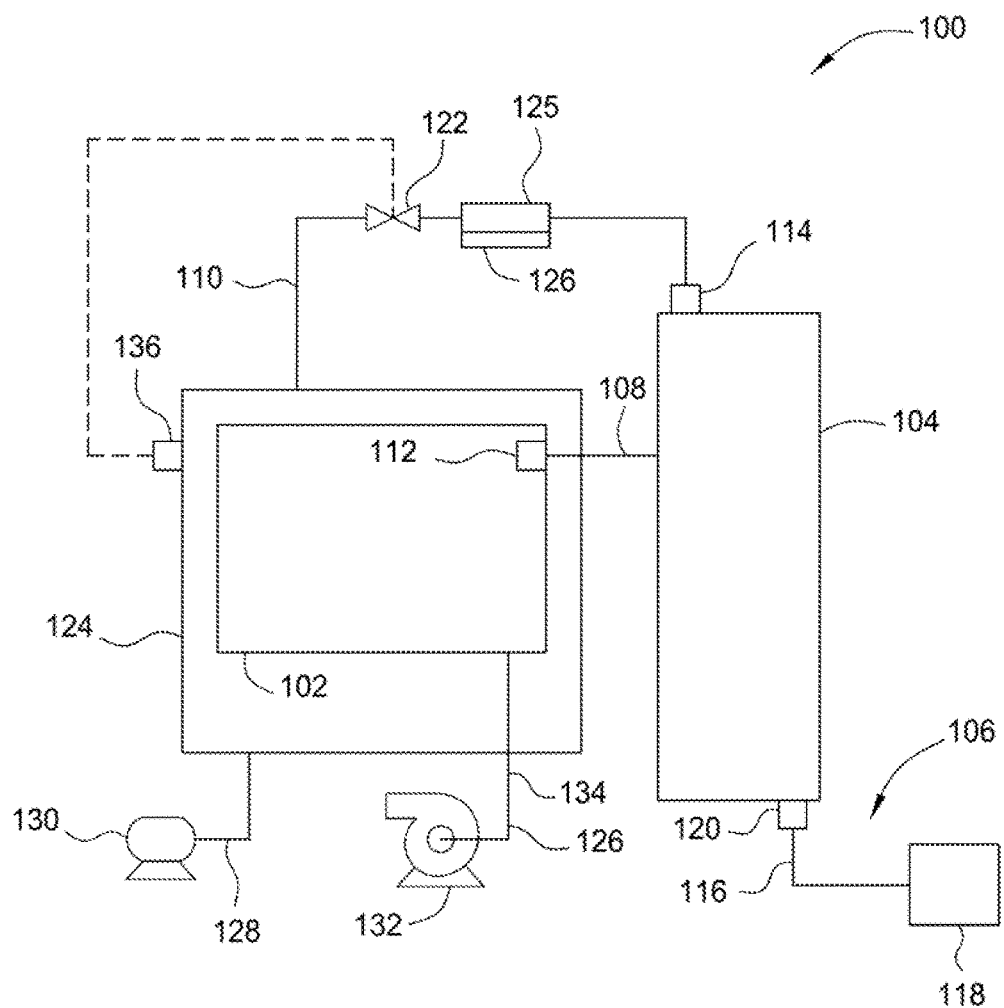
FIG. 1 is a schematic cross-sectional view of a process chamber according to one embodiment.

FIG. 1 is a schematic view of a semiconductor processing system 100 according to one embodiment. The processing system 100 has a reactor 102, a gas panel 104 for flowing gases to the reactor 102, and an exhaust system 106 coupled to the gas panel. The gas panel 104 has one or more conduits 108 that carry gases to the reactor 102. Valves and fittings in the gas panel 104 control flow of gases through the conduits 108. Process gas flows into the reactor 102 through inlet 112, and is exhausted from the reactor 102 through exhaust line 134. A pump 132, such as a vacuum pump, may be used to exhaust gas from the reactor 102.

The reactor 102 is typically housed in an enclosure 124. A flush gas is typically flowed through the enclosure 124 from a gas source 130, for example a blower or air mover, through a conduit 128. The flush gas flows through the enclosure 124 and around the reactor 102 entraining any gases that escape the reactor 102 or connected piping. The flush gas may be any convenient ambient gas mixture, such as air.

An exhaust duct 110 couples the reactor enclosure 124 to the gas panel 104. The exhaust line 110 is coupled to an exhaust gas inlet 114 of the gas panel 104, and provides gas for flushing the interior of the gas panel 104 to remove fugitive gases from the fittings and valves in the gas panel 104. Flush gas flows from the reactor enclosure 124 through the conduit 110 to the inlet 114. The exhaust gas inlet 114 may be located in any convenient location of the gas box. A damper 122 may be disposed in the exhaust line 110 to control pressure in the reactor enclosure 124 and/or flow of exhaust gas through the gas panel 104. A pressure sensor 136 may be used to maintain a desired pressure in the reactor enclosure 124 by controlling the damper 122 based on a pressure signal from the pressure sensor. A diaphragm or piezoelectric device may be used for such a pressure sensor.

An exhaust line 116 couples the gas panel 104 to an exhaust pump 118. The exhaust line 116 is coupled to an exhaust outlet 120 of the gas panel 104. The exhaust outlet 120 may be positioned to maximize flow of gas through the gas panel 104 and removal of all gases from the gas panel 104.

If gases exhausted from the reactor enclosure 124 are above a temperature tolerance for the gas panel 104, a cooler 125 may be used in the exhaust line 116 to cool the gases. The cooler may be a heat exchanger, a radiator, or a cooling jacket. For the heat exchanger and cooling jacket, a cooling medium such as water may be used to cool the exhaust gases. The cooler 125 may include a liquid collector 126 for collecting any liquids that may condense from the exhaust gases. Liquids from the liquid collector 126 may be routed to a liquid waste disposal system, or recycled to the cooler 125 for heat integration. If the liquids are flashed into gas in the cooler 125, the resulting gas may be routed to the exhaust line 116.

Figure 2:
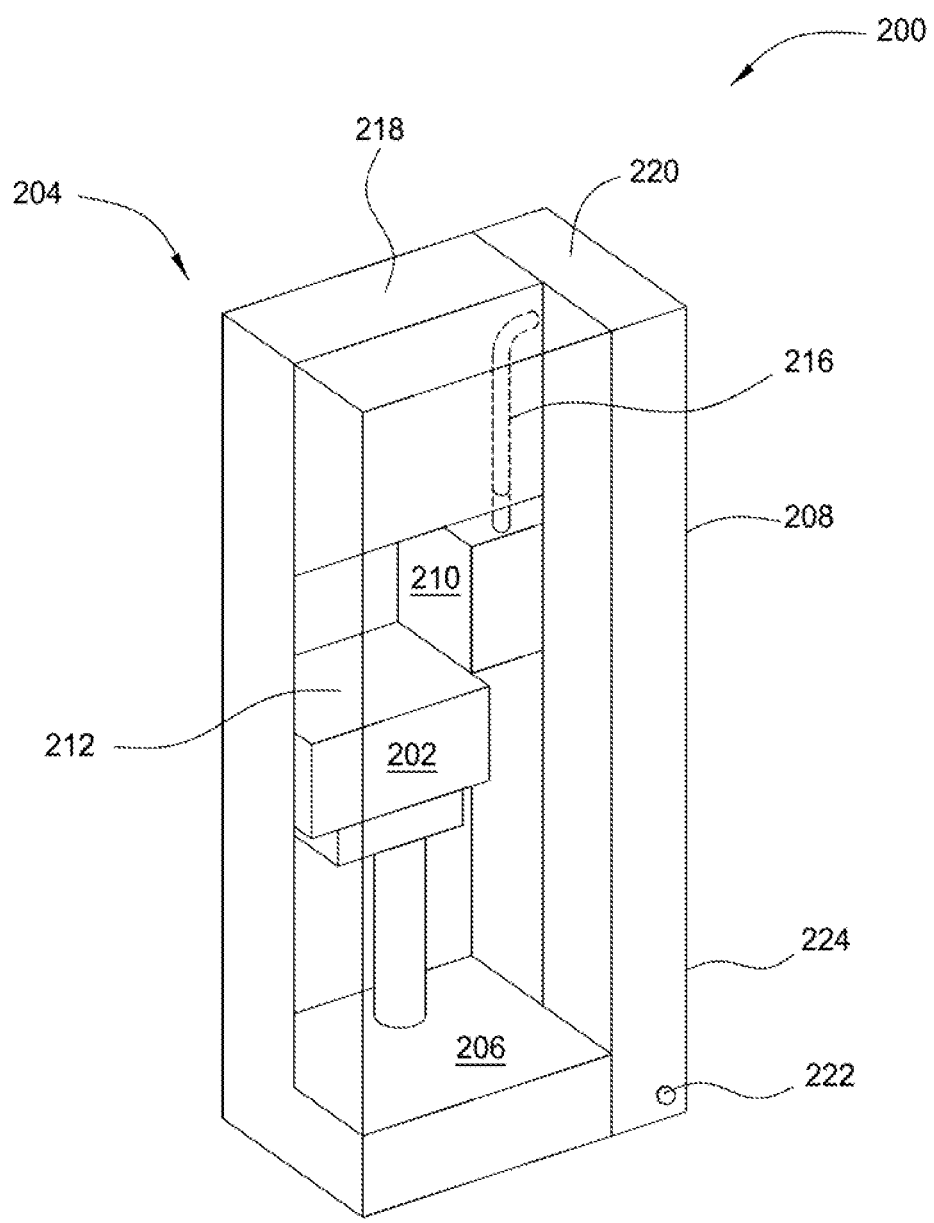
FIG. 2 is a perspective view of a semiconductor processing system according to another embodiment.

FIG. 2 is a perspective view of a semiconductor processing system 200 according to another embodiment. A processing chamber 202 is disposed in a frame 204 that has a floor 206 on which the processing chamber 202 rests. A gas panel 208 is coupled to the frame 204 and has gas conduits, which are not visible in the embodiment of FIG. 2, that supply gases to the processing chamber 202. The gas panel 208 extends vertically along one side of the frame 204, with a lower portion of the gas panel 208 adjacent to the floor 206 and an upper portion of the gas panel 208 adjacent to an overhead portion 218 of the frame 204. The frame 204 has an enclosure 212 that separates the processing chamber 202 from the external environment to contain any gases that escape from the processing chamber 202 or piping connected to the processing chamber 202. In FIG. 2, the enclosure 212 is shown as partially transparent, but the portion of the enclosure 212 shown as transparent may be opaque, or may have any degree of light transmissivity between transparent and opaque.

A chamber exhaust handler 210 may be coupled to the frame 204 and to an upper portion 218 of the processing chamber 202. The chamber exhaust handler 210 forces gas from the enclosure 212 through an exhaust line 216. Fresh gas may be added to the enclosure through one or more openings in the floor 206, or through any convenient passage. The exhaust line 216, shown partially in phantom, couples the chamber exhaust handler 210 to the gas panel 208 through the overhead portion 218 of the frame 204. The exhaust line 216 couples to the gas panel 208 at an upper portion 220 of the gas panel 208. A gas panel exhaust port 222 at a lower portion 224 of the gas panel 208 allows exhaust gases to be evacuated from the gas panel 208. An exhaust pump (not shown) may be connected to the gas panel exhaust port 222 to route the exhaust gases to an environmental control apparatus or waste disposal system, if desired. The chamber exhaust line 214, chamber exhaust handler 210, exhaust line 216, gas panel 208, and gas panel exhaust port 222 form a single exhaust gas pathway common to the processing chamber 202 and the gas panel 208. As with the embodiment of FIG. 1, the chamber exhaust handler 210 may include a valve (not shown) and a cooler (not shown), which may have liquids handling and heat integration capabilities, if desired. It should be noted that flush gas might flow in the opposite direction in some embodiments, into the gas panel 208 through the opening 222, out of the gas panel through the conduit 216 into the enclosure 212, and then out through the floor 206, through any suitable opening therein. The chamber exhaust handler 210 may be oriented to flow gas in either direction. Additionally, the chamber exhaust handler 210 may be disposed inside the overhead portion 218 and fluidly coupled to the enclosure 212 and the conduit 216.

Use of a single exhaust pathway for the processing chamber and the gas panel provides benefits in reducing the quantity of gas used to exhaust the semiconductor processing system 200. The processing chamber 202 may be exhausted by pressure of fresh gases flowing into the processing chamber 202 from the gas panel 208, and gases exhausted from the processing chamber 202 may be used to purge the gas panel 208 of fugitive emissions from the valves and fittings in the gas panel. Reduction of exhaust gas volume reduces load on waste gas handling facilities, reducing the overall cost of semiconductor manufacturing.

The apparatus 200 may include the pressure sensor 136 inside, or coupled to, the enclosure 212, the damper 122 disposed in the chamber exhaust handler 210, the conduit 216, or the upper portion 220 of the gas panel 208, the cooler 125 disposed in the chamber exhaust handler 210, the conduit 216, or the upper portion 220 of the gas panel 208, and/or the liquid collector 126 disposed in the chamber exhaust handler 210, coupled to the conduit 216, or disposed in the upper portion 220 of the gas panel 208.

While the foregoing is directed to embodiments of the present invention, other and further embodiments of the invention may be devised without departing from the basic scope thereof, and the scope thereof is determined by the claims that follow.

The invention claimed is:

1. A substrate processing apparatus, comprising:
   an enclosure;
   a reactor disposed within the enclosure;
   a gas panel coupled to the reactor;
   a chamber exhaust handler fluidly coupled to the enclosure;
   a first exhaust conduit fluidly coupled at a first end to the chamber exhaust handler and at a second end to an exhaust inlet of the gas panel; and
   a second exhaust conduit fluidly coupled at a third end to an exhaust outlet of the gas panel and at a fourth end to an exhaust pump.

2. The substrate processing apparatus of claim 1, wherein the chamber exhaust handler is located in the enclosure.

3. The substrate processing apparatus of claim 2, further comprising a damper disposed in the first exhaust conduit.

4. The substrate processing apparatus of claim 3, further comprising a frame, wherein the first exhaust conduit is disposed through an overhead portion of the frame.

5. The substrate processing apparatus of claim 4, further comprising a cooler fluidly coupled to the first exhaust conduit.

6. The substrate processing apparatus of claim 5, wherein the cooler comprises a liquid collector.

7. A substrate processing apparatus, comprising:
   a reactor disposed within the substrate processing apparatus;
   a gas panel coupled to the reactor;
   a chamber exhaust handler fluidly coupled to the processing apparatus;
   a first exhaust conduit fluidly coupled at a first end to the chamber exhaust handler and at a second end to an exhaust inlet of the gas panel; and
   a second exhaust conduit fluidly coupled at a third end to an exhaust outlet of the gas panel and at a fourth end to an exhaust pump.

8. The substrate processing apparatus of claim 7, wherein the chamber exhaust handler is located in the substrate processing apparatus.

9. The substrate processing apparatus of claim 8, further comprising a damper disposed in the first exhaust conduit.

10. The substrate processing apparatus of claim 9, further comprising a frame, wherein the first exhaust conduit is disposed through an overhead portion of the frame.

11. The substrate processing apparatus of claim 10, further comprising a cooler fluidly coupled to the first exhaust conduit.

* * * * *